(12) United States Patent
Kim et al.

(10) Patent No.: US 9,473,154 B2
(45) Date of Patent: Oct. 18, 2016

(54) SEMICONDUCTOR DEVICE AND PHASE LOCKED LOOP INCLUDING THE SAME

(71) Applicant: Samsung Electronics Co., Ltd., Suwon-si, Gyeonggi-do (KR)

(72) Inventors: Woo-Seok Kim, Suwon-si (KR); Tae-Ik Kim, Seongnam-si (KR); Ji-Hyun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 43 days.

(21) Appl. No.: 14/632,468

(22) Filed: Feb. 26, 2015

(65) Prior Publication Data

US 2016/0056826 A1    Feb. 25, 2016

(30) Foreign Application Priority Data

Aug. 25, 2014  (KR) .................. 10-2014-0110756

(51) Int. Cl.
  *H03L 7/06*      (2006.01)
  *H03L 7/089*     (2006.01)
  *H02M 3/04*      (2006.01)

(52) U.S. Cl.
  CPC .............. *H03L 7/0891* (2013.01); *H02M 3/04* (2013.01)

(58) Field of Classification Search
  None
  See application file for complete search history.

(56) References Cited

U.S. PATENT DOCUMENTS

| 6,445,211 | B1 | 9/2002 | Saripella |
| 6,639,475 | B2 | 10/2003 | Ichimaru |
| 6,989,698 | B2 | 1/2006 | Jeong |
| 7,339,438 | B2 | 3/2008 | Sohn |
| 7,439,784 | B2 | 10/2008 | Lin |

(Continued)

FOREIGN PATENT DOCUMENTS

| JP | 11214989 A | 8/1999 |
| KR | 0383116 A | 5/2002 |
| KR | 0750059 A | 5/2003 |

OTHER PUBLICATIONS

Jia Yaoyao et al, "A Charge Pump with reduced current variation and mismatch in low-voltage low-power PLLs", University of Electronic Scienc and Technology of China, 2013, 2 pp.

Sleiman Bou-Sleiman et al., "A Nanoscale CMOS Charge Pump with Near Perfect Current Matching", Analog VLSI Laboratory, The Ohio State University, 2013, pp. 1100-1103.

(Continued)

*Primary Examiner* — Cassandra Cox
(74) *Attorney, Agent, or Firm* — Harness, Dickey & Pierce, P.L.C.

(57) ABSTRACT

Provided are a semiconductor device and a phase-locked loop (PLL) including the same. The semiconductor device including an output node from which an output signal is output, a first transistor which has a drain connected to the output node and is gated by a first signal to increase a voltage level of the output node, a second transistor which has a drain connected to the output node, is gated by a second signal which is a complementary signal of the first signal, and reduces the voltage level of the output node, a pull-up circuit which provides a first compensation current varying according to the voltage level of the output node to a source of the first transistor, and a pull-down circuit which provides a second compensation current varying according to the voltage level of the output node to a source of the second transistor.

19 Claims, 20 Drawing Sheets

(56) References Cited

U.S. PATENT DOCUMENTS

| | | |
|---|---|---|
| 7,646,226 B2 | 1/2010 | Kim |
| 8,054,115 B2 | 11/2011 | Shin |
| 8,188,777 B2 | 5/2012 | Yamaguchi |
| 8,198,927 B2 | 6/2012 | Moore |
| 8,472,218 B2 | 6/2013 | Lin |
| 2015/0200588 A1* | 7/2015 | Cheng .................. H03L 7/0896 327/536 |
| 2015/0333623 A1* | 11/2015 | Chiu ....................... H02M 3/07 327/536 |

OTHER PUBLICATIONS

M.-S. Hwang, et al., "Reduction of pump current mismatch in charge-pump PLL", Electronics Letters Jan. 29, 2009, vol. 45 No. 3, 2pp.

* cited by examiner

1200

SEMICONDUCTOR DEVICE AND PHASE LOCKED LOOP INCLUDING THE SAME

This application claims priority from Korean Patent Application No. 10-2014-0110756 filed on Aug. 25, 2014 in the Korean Intellectual Property Office, the disclosure of which is incorporated herein by reference in its entirety.

BACKGROUND

1. Field

The present inventive concepts relate to a semiconductor device and a phase-locked loop (PLL) including the same.

2. Description of the Related Art

Phase-locked loops (PLLs) are commonly used in many electronics circuits and are particularly important in communication circuits. For example, digital systems use clock signals to trigger synchronous circuits, e.g., flip-flops. Transmitter and receiver systems use local oscillator (LO) signals for frequency upconversion and downconversion, respectively. Wireless devices (e.g., cellular phones) in wireless communication systems typically use clock signals for digital circuitry and LO signals for transmitter and receiver circuitry. Clock and LO signals are often generated with voltage-controlled oscillators (VCOs) operating within PLLs.

A PLL typically includes a phase frequency detector (PFD), a charge pump, a loop filter, and a VCO. The PFD, the charge pump, and the loop filter collectively detect phase error between a reference signal and a clock signal derived from the VCO and generate a control signal Vctrl for the VCO. The control signal adjusts the frequency of the VCO such that the clock signal is locked to the reference signal.

A current mismatch that occurs in the charge pump during the operation of the PLL increases the jitter of the PLL. To prevent this problem, only a part in which the difference between an up signal and a down signal input to the charge pump is small may be used. However, this can limit the operating range of the charge pump.

SUMMARY

Aspects of the present inventive concepts provide a semiconductor device including a compensation circuit which increases the operating range of a charge pump by generating a compensation current for reducing a current mismatch of the charge pump.

Aspects of the present inventive concepts also provide a phase-locked loop (PLL) including a compensation circuit which increases the operating range of a charge pump by generating a compensation current for reducing a current mismatch of the charge pump.

However, aspects of the present inventive concepts are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor device including an output node from which an output signal is output, a first transistor which has a drain connected to the output node and is gated by a first signal to increase a voltage level of the output node, a second transistor which has a drain connected to the output node, is gated by a second signal which is a complementary signal of the first signal, and reduces the voltage level of the output node, a pull-up circuit which provides a first compensation current varying according to the voltage level of the output node to a source of the first transistor, and a pull-down circuit which provides a second compensation current varying according to the voltage level of the output node to a source of the second transistor.

According to another aspect of the present inventive concept, there is provided a semiconductor device including a charge pump circuit which increases a voltage level of an output node by receiving a pull-up current and reduces the voltage level of the output node by outputting a pull-down current, a pull-up circuit which provides a first compensation current for increasing the magnitude of the pull-up current to a source of a first transistor when the voltage level of the output node increases from a first level to a second level higher than the first level, and a pull-down circuit which provides the second compensation current for increasing the magnitude of the pull-down current to a source of a second transistor when the voltage level of the output node decreases from a third level to a fourth level lower than the third level.

According to another aspect of the present inventive concepts, there is provided a phase-locked loop (PLL) including a charge pump, a phase frequency detector (PFD) which provides an up input signal and a down input signal, which is a complementary signal of the up signal, to the charge pump, and a loop filter which is connected to an output node of the charge pump, wherein the charge pump comprises, a first transistor which is gated by the up signal, a second transistor which is gated by the down signal, the output node which is connected to a drain of the first transistor and a drain of the second transistor, a pull-up circuit which comprises a third transistor gated by an output voltage of the output node and a fourth transistor gated by a drain voltage of the third transistor and connected to the first transistor, and a pull-down circuit which comprises a fifth transistor gated by the output voltage and a sixth transistor gated by a drain voltage of the fifth transistor and connected to the second transistor.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EXAMPLE EMBODIMENTS

Figure 1:
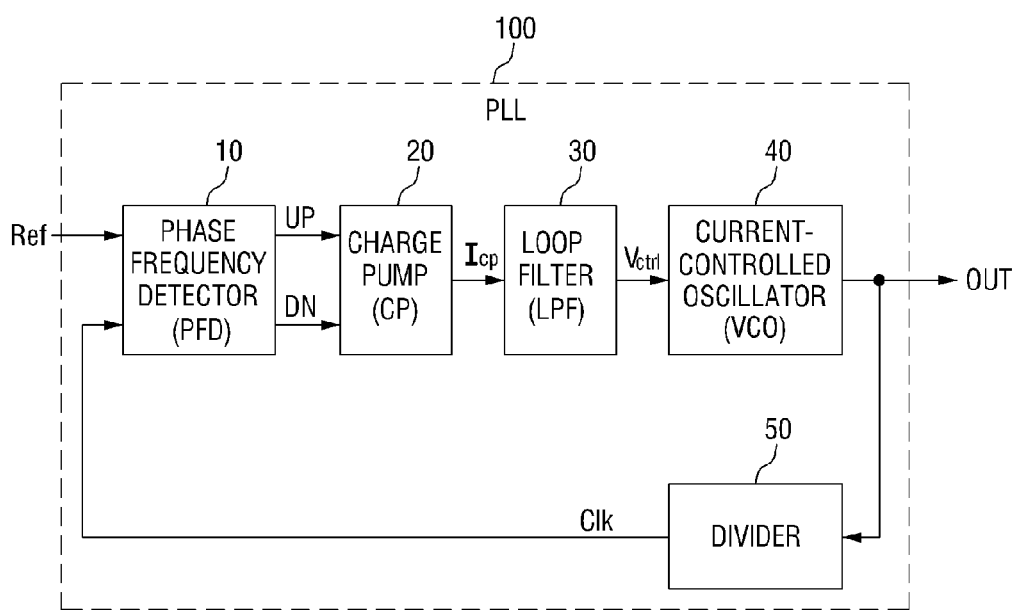
FIG. 1 is a block diagram of a phase-locked loop (PLL) according to embodiments of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, semiconductor devices and a phase-locked loop (PLL) including the same according to embodiments of the present inventive concepts will be described with reference to FIGS. 1 through 20.

FIG. 1 is a block diagram of a PLL 100 according to embodiments of the present inventive concepts.

Referring to FIG. 1, the PLL 100 according to the embodiments of the present inventive concepts includes a phase frequency detector (PFD) 10, a charge pump 20, a loop filter 30, a voltage-controlled oscillator (VCO) 40, and a divider 50.

The PFD 10 may receive a reference signal Ref from a reference oscillator (not illustrated in FIG. 1) and a clock signal Clk from the divider 50. The PFD 10 compares a phase of the reference signal Ref with a phase of the clock signal Clk and provides up and down signals UP and DN indicative of the phase error or difference between the reference signal Ref and the clock signal Clk.

The clock signal Clk may also be referred to as a divided clock signal, a feedback signal, etc. In addition, the up signal UP and the down signal DN are commonly referred to as a leading signal and a lagging signal or an advance signal and a retard signal.

The charge pump 20 receives the up signal UP and the down signal DN and generates an output signal Icp. The output signal Icp is an electric current that teaches the detected phase error. The charge pump 20 will be described in detail later.

The loop filter 30 filters the output signal Icp from the charge pump 20 and generates a control signal Vctrl for the VCO 40. The loop filter 30 may adjust the control signal Vctrl such that the phase or frequency of the clock signal Clk is locked to the phase or frequency of the reference signal Ref. The loop filter 30 has a frequency response that is typically selected to achieve a desired closed-loop response for the PLL 110. For example, the frequency response of the loop filter 30 may be selected based on a tradeoff between gain and tracking performance and PLL noise performance, but the present inventive concepts are not limited thereto. The loop filter 30 may include a low pass filter (LPF).

The VCO 40 generates an oscillator signal OUT having a frequency that is determined by the control signal Vctrl from the loop filter 30.

The divider 50 generates the clock signal Clk by dividing the oscillator signal OUT in frequency by integer factors of N and N+1 and provides the clock signal Clk to the PFD 10. Generally, N may be any positive integer value.

The PLL 100 according to the embodiments of the present inventive concepts can be used for various types of circuits such as integer-N PLLs, fractional-N PLLs, multi-modulus dividers (MMDs), and signal-delta frequency synthesizers. An integer-N PLL divides the frequency of an oscillator signal from a VCO by an integer divider ratio N, where N≥1. A fraction-N PLL divides the frequency of the oscillator signal by a non-integer divider ratio R, for example, by N in some cases and by N+1 in some other cases, where N<R<N+1. A sigma-delta frequency synthesizer uses a sigma-delta modulator (not illustrated) to generate the non-integer divider ratio R for the fractional-N PLL.

More specifically, the PFD 10 of the PLL 100 typically generates a pair of signals referred to as the up signal UP and the down signal DN. The pair of signals may be typically turned on longer in each clock signal depending on whether the clock signal Clk leads or lags behind the reference signal Ref.

The up signal UP and the down signal DN are used to connect current sources inside the charge pump 20 to the output. Ideally, the PFD 10 and the charge pump 20 should have a linear transfer function of output charge versus phase error. However, this linear transfer function may not be achieved due to mismatch of circuits used in the charge pump 20. As a result, the output charge from the up signal UP may often not be equal to the output charge from the down signal DN due to phase errors of the same magnitude but opposite polarity. This charge error is due to up/down current mismatch in the charge pump 20 which may result from transistor device mismatch and other factors. Non-linearity of the charge pump 20 due to current mismatch may cause additional phase noise that may degrade performance. A pull-up circuit 110 (see FIG. 2) and a pull-down circuit 120 (see FIG. 2) which can reduce current mismatch of the charge pump 20 will hereinafter be described in detail.

Figure 2:
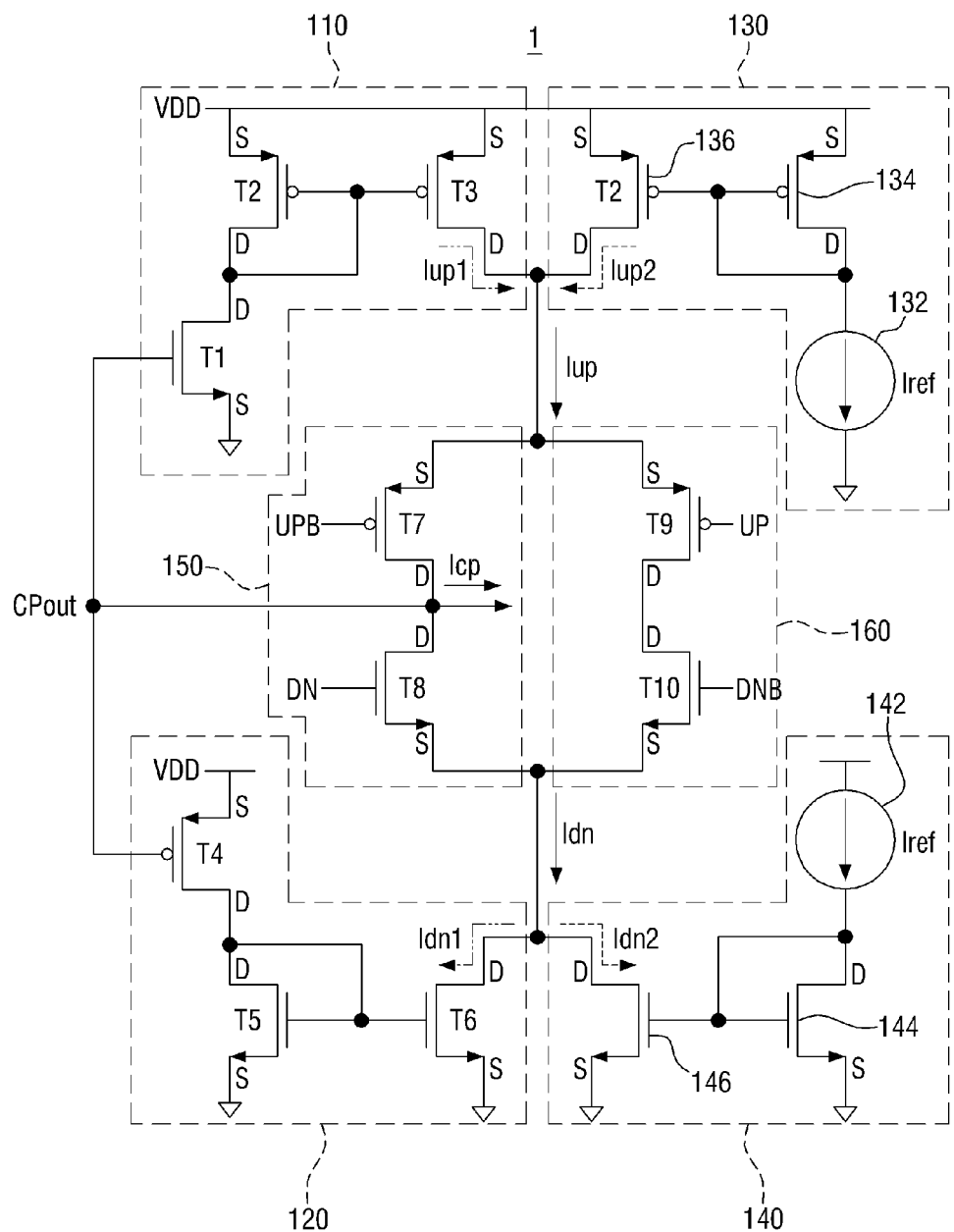
FIG. 2 is a circuit diagram of a semiconductor device according to a first embodiment of the present inventive concepts.

FIG. 2 is a circuit diagram of a semiconductor device 1 according to a first embodiment of the present inventive concepts.

Referring to FIG. 2, the semiconductor device 1 according to the first embodiment of the present inventive concepts includes a charge pump 20. The semiconductor device 1 includes a pull-up circuit 110, a pull-down circuit 120, a first switch unit 150, a second switch unit 160, a first reference current circuit 130, and a second reference current circuit 140.

The first switch unit 150 includes a first transistor T7, a second transistor T8, and an output node CPout from which an output signal Icp is output.

The first transistor T7 may have a drain connected to the output node CPout and may be gated by a first signal to increase a level of the output node CPout. The first transistor T7 may include a PMOS transistor, and the first signal may be an inverted up signal UPB input from a PFD 10. A source of the first transistor T7 may be connected to the first reference current circuit 130.

The second transistor T8 may have a drain connected to the output node CPout and may be gated by a second signal, which is a complementary signal of the first signal, to reduce the level of the output node CPout. The second transistor T8 may include an NMOS transistor, and the second signal may be a down signal DN input from the PFD 10. A source of the second transistor T8 may be connected to the second reference current circuit 140.

The first reference current circuit 130 may provide a first reference current Iup2 to the source of the first transistor T7. The first reference current circuit 130 may include, but not limited to, a first reference current source 132, a first PMOS transistor 134 which has a gate and a drain connected to the first reference current source 132, and a second PMOS transistor 136 which has a gate connected to the first reference current source 132 and provides the first reference current Iup2.

Specifically, the first reference current source 132 may be an ideal current source that causes an electric current to flow from a source terminal of the second PMOS transistor 135 to a drain terminal of the second PMOS transistor 135. The gate level of the second PMOS transistor 136 is lowered by the first reference current source 132. Accordingly, the first reference current Iup2 flows from the source of the second PMOS transistor 136 to the drain of the second PMOS transistor 136. The first reference current Iup2 may flow to the source of the first transistor T7.

Likewise, the second reference current circuit 140 may cause a second reference current Idn2 to be output through the source of the second transistor T8. The second reference current circuit 140 may include, but not limited to, a second reference current source 142, a first NMOS transistor 144 which has a gate and a drain connected to the second reference current source 142, and a second NMOS transistor 146 which has a gate connected to the second reference current source 142 and provides the second reference current Idn2.

Specifically, the second reference current source 142 may be an ideal current source that causes an electric current to flow from a VDD terminal to a source terminal of the first NMOS transistor 146. The gate level of the second NMOS transistor 146 is raised by the second reference current source 142. Accordingly, the second reference current Idn2 flows from a drain of the second PMOS transistor 146 to the source of the second PMOS transistor 146. The second reference current Idn2 may be output from the source of the second transistor T8.

The second switch unit 160 may be connected to the first switch unit 150. The second switch unit 160 includes a third transistor T9 and a fourth transistor T10. The second switch unit 160 may increase the operating speed of the charge pump 20, but the present inventive concepts are not limited thereto. The second switch unit 160 can be omitted.

Specifically, the third transistor T9 may have a drain connected to a drain of the fourth transistor T10 and may be gated by a first signal. The third transistor T9 may include a PMOS transistor, and the first signal may be an up signal UP input from the PFD 10. A source of the third transistor T9 may be connected to the first reference current circuit 130, but the present inventive concepts are not limited thereto.

The fourth transistor T10 may have the drain connected to the drain of the third transistor T9 and may be gated by a second signal which is a complementary signal of the first signal. The fourth transistor T10 may include an NMOS transistor, and the second signal may be an inverted down signal DNB input from the PFD 10. A source of the fourth transistor T10 may be connected to the second reference current circuit 140, but the present inventive concepts are not limited thereto.

The pull-up circuit 110 may provide a first compensation current Iup1, which varies according to the level of the output node CPout, to the first transistor T7 of the first switch unit 150. An output terminal of the pull-up circuit 110 may be connected to the source of the first transistor T7. Specifically, the pull-up circuit 110 may include a first NMOS transistor T1 which is gated by the level of the output node CPout, a first PMOS transistor T2 which has a gate and a drain connected to a drain of the first NMOS transistor T1, and a second PMOS transistor T3 which has a gate connected to the drain of the first NMOS transistor T1 and provides the first compensation current Iup1.

The output signal (current) Icp output from the output node CPout corresponds to the sum (i.e., a pull-up current Iup) of the first compensation current Iup1 and the first reference current Iup2. When turned on, the first transistor T7 of the first switch unit 150 may provide the pull-up current Iup to the output node CPout. Here, the pull-up current Iup may flow from the source of the first transistor T7 toward the drain of the first transistor T7.

The first compensation current Iup1 output from the pull-up circuit 110 may increase when the level of the output signal Icp of the output node CPout increases from a first level to a second level higher than the first level. That is, the pull-up circuit 110 may increase the magnitude of the pull-up current Iup by providing the first compensation current Iup1 to the source of the first transistor T7.

Likewise, the pull-down circuit 120 may provide a second compensation current Idn1, which varies according to the level of the output node CPout, to the second transistor T8 of the first switch unit 150. An output terminal of the pull-down circuit 120 may be connected to the source of the second transistor T8. Specifically, the pull-down circuit 120 may include a first PMOS transistor T4 which is gated by the level of the output node CPout, a first NMOS transistor T5 which has a gate and a drain connected to a drain of the first PMOS transistor T4, and a second NMOS transistor T6 which has a gate connected to the drain of the first PMOS transistor T4 and provides the second compensation current Idn1.

A pull-down current Idn input through the output node CPout corresponds to the sum of the second compensation current Idn1 and the second reference current Idn2. When turned on, the second transistor T8 of the first switch unit 150 may provide the pull-down current Idn input through the output node CPout. Here, the pull-down current Idn may flow from the drain of the second transistor T8 toward the source of the second transistor T8.

The second compensation current Idn1 output from the pull-down circuit 120 may increase when the level of the output signal Icp of the output node CPout decreases from a third level to a fourth level lower than the third level. That is, the pull-down circuit 120 can increase the magnitude of the pull-down current Idn by providing the second compensation current Idn1 to the source of the second transistor T8.

The first compensation current Iup1 and the second compensation current Idn1 can reduce the current mismatch between the pull-up current Iup and the pull-down current Idn. That is, compared with the charge pump 20 without the pull-up circuit 110 and the pull-down circuit 120, a circuit including the pull-up circuit 110 and the pull-down circuit 120 can have a significantly increased operating range, in which no current mismatch occurs, because the pull-up circuit 110 and the pull-down circuit 120 provide the first compensation current Iup1 and the second compensation current Idn1.

Figure 3:
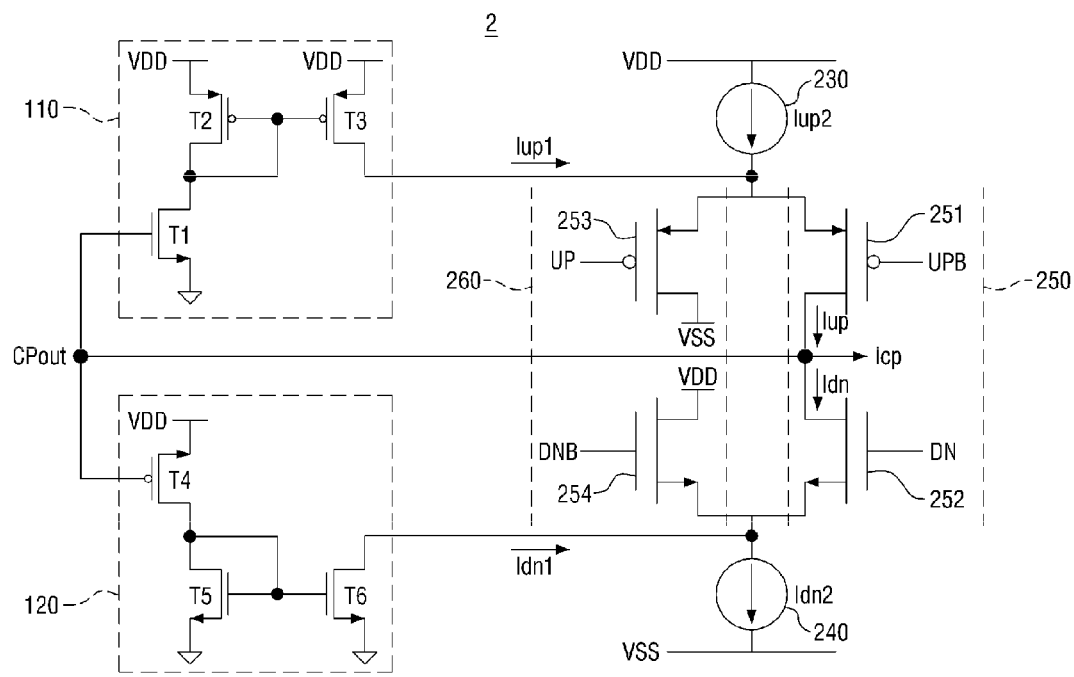
FIG. 3 is a circuit diagram of a semiconductor device according to a second embodiment of the present inventive concepts.

FIG. 3 is a circuit diagram of a semiconductor device 2 according to a second embodiment of the present inventive concepts. For simplicity, a redundant description of elements identical to those of the above-described embodiment will be omitted, and the current embodiment will hereinafter be described, focusing mainly on differences with the above-described embodiment.

Referring to FIG. 3, the semiconductor device 2 according to the second embodiment of the present inventive concepts includes a pull-up circuit 110, a pull-down circuit 120, a first switch unit 250, a second switch unit 260, a first reference current source 230, and a second reference current source 240.

The pull-up circuit 110, the pull-down circuit 120 and the first switch unit 250 of the semiconductor device 2 according to the second embodiment may be configured and operate in substantially the same way as the pull-up circuit 110, the pull-down circuit 120 and the first switch unit 150 of the semiconductor device 1 according to the first embodiment, but the present inventive concepts are not limited thereto.

The second switch unit 260 may be connected to the first switch unit 250. The second switch unit 260 includes a third transistor 253 and a fourth transistor 254. Like the second switch unit 160 of the semiconductor device 1 according to the first embodiment, the second switch unit 260 may increase the operating speed of a charge pump 20. However, the present inventive concepts are not limited thereto, and the second switch unit 260 can be omitted.

Specifically, the third transistor 253 may have a drain connected to a VSS terminal and may be gated by a first signal. The third transistor 253 may include a PMOS transistor, and the first signal may be an up signal UP input from a PFD 10. A source of the third transistor 253 may be connected to the first reference current source 230, but the present inventive concepts are not limited thereto.

The fourth transistor 254 may have a drain connected to a VDD terminal and may be gated by a second signal which is a complementary signal of the first signal. The fourth transistor 254 may include an NMOS transistor, and the second signal may be an inverted down signal DNB input from the PFD 10. A source of the fourth transistor 254 may be connected to the second reference current source 240, but the present inventive concepts are not limited thereto.

Each of the first reference current source 230 and the second reference current source 240 may include an ideal current source.

A side of the first reference current source 230 may be connected to (a source of a first transistor 251 of the first switch unit 250, the source of the third transistor 253 of the second switch unit 260, and an output terminal of the pull-up circuit 110. The other side of the first reference current source 230 may be connected to a VDD terminal. The first reference current source 230 may provide a first reference current Iup2.

When turned on, the first transistor 251 of the first switch unit 250 may provide a pull-up current Iup to an output node CPout. Here, the pull-up current Iup corresponds to the sum of the first reference current Iup2 of the first reference current source 230 and a first compensation current Iup1 of the pull-up circuit 110. The pull-up current Iup may flow from the source of the first transistor 251 toward a drain of the first transistor 251.

Likewise, a side of the second reference current source 240 may be connected to a source of a second transistor 252 of the first switch unit 250, the source of the fourth transistor 254 of the second switch unit 260, and an output terminal of the pull-down circuit 120. The other side of the second reference current source 240 may be connected to a VSS terminal. The second reference current source 240 may provide a second reference current Idn2.

When turned on, the second transistor 252 of the first switch unit 250 may provide a pull-down current Idn input through the output node CPout. Here, the pull-down current Idn corresponds to the sum of the second reference current Idn2 of the second reference current source 240 and a second compensation current Idn1 of the pull-down circuit 120. The pull-down current Idn may flow from a drain of the second transistor 252 toward the source of the second transistor 252.

The semiconductor device 2 according to the second embodiment of the present inventive concepts may be substantially similar in effect to the semiconductor device 1 according to the first embodiment of the present inventive concepts, except for structure.

Figure 4:
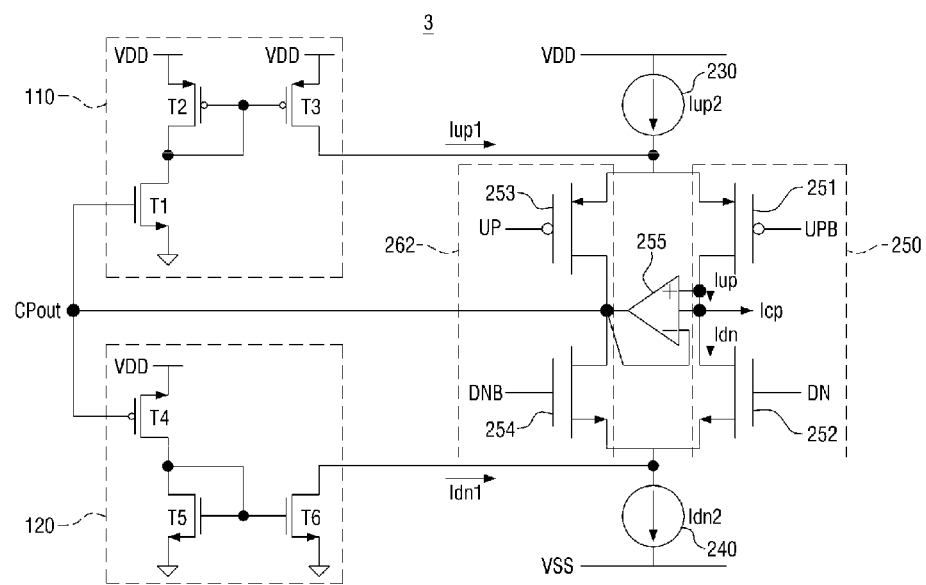
FIG. 4 is a circuit diagram of a semiconductor device according to a third embodiment of the present inventive concepts.

FIG. 4 is a circuit diagram of a semiconductor device 3 according to a third embodiment of the present inventive concepts. For simplicity, a redundant description of elements identical to those of the above-described embodiments will be omitted, and the current embodiment will hereinafter be described, focusing mainly on differences with the above-described embodiments.

Referring to FIG. 4, the semiconductor device 3 according to the third embodiment of the present inventive concepts includes a pull-up circuit 110, a pull-down circuit 120, a first switch unit 250, a second switch unit 262, a first reference current source 230, a second reference current source 240, and an operational amplifier 255.

The pull-up circuit 110, the pull-down circuit 120, the first switch unit 250, the first reference current source 230 and the second reference current source 240 of the semiconductor device 3 according to the third embodiment of the present inventive concepts may be configured and operate in substantially the same way as the pull-up circuit 110, the pull-down circuit 120, the first switch unit 250, the first reference current source 230 and the second reference current source 240 of the semiconductor device 2 according to the second embodiment of the present inventive concepts, but the present inventive concepts are not limited thereto.

The second switch unit 262 may be connected to the first switch unit 250. The second switch unit 262 includes a third transistor 253 and a fourth transistor 254.

Specifically, the third transistor 253 may have a drain connected to a drain of the fourth transistor 254 and may be gated by a first signal. The third transistor 253 may include a PMOS transistor, and the first signal may be an up signal UP input from a PFD 10. A source of the third transistor 253 may be connected to the first reference current source 230, but the present inventive concepts are not limited thereto.

The fourth transistor 254 may have the drain connected to the drain of the third transistor 253 and may be gated by a second signal which is a complementary signal of the first signal. The fourth transistor 254 may include an NMOS transistor, and the second signal may be an inverted down signal DNB input from the PFD 10. A source of the fourth transistor 254 may be connected to the second reference current source 240, but the present inventive concepts are not limited thereto.

The operational amplifier 255 may have an output terminal connected to the third transistor 253 and the fourth transistor 254. Specifically, the output terminal of the operational amplifier 255 may be connected to the drain of the third transistor 253 and the drain of the fourth transistor 254. One of inputs of the operational amplifier 255 may be connected to an output node CPout. The output terminal of the operational amplifier 255 may be connected to the output node CPout. The operational amplifier 255 may minimize static phase errors by actively making a voltage of the output node CPout included in the first switch unit 250 equal to voltages of the drains of the third and fourth transistors 253 and 254, but the present inventive concepts are not limited thereto. Accordingly, the operating speed of a charge pump 20 can be increased.

The semiconductor device 3 according to the third embodiment of the present inventive concepts may be substantially similar in effect to the semiconductor device 1 according to the first embodiment of the present inventive concepts, except for structure.

Figure 5:
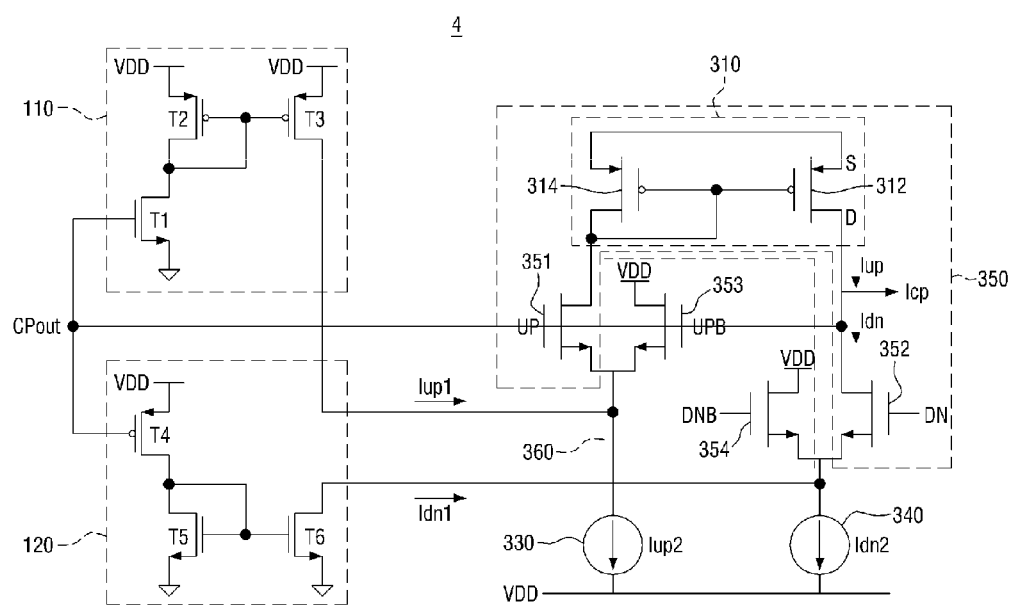
FIG. 5 is a circuit diagram of a semiconductor device according to a fourth embodiment of the present inventive concepts.

FIG. 5 is a circuit diagram of a semiconductor device 4 according to a fourth embodiment of the present inventive concepts. For simplicity, a redundant description of elements identical to those of the above-described embodiments will be omitted, and the current embodiment will hereinafter be described, focusing mainly on differences with the above-described embodiments.

Referring to FIG. 5, the semiconductor device 4 according to the fourth embodiment of the present inventive concepts includes a pull-up circuit 110, a pull-down circuit 120, a first switch unit 350, and a second switch unit 360. The pull-up circuit 110 and the pull-down circuit 120 of the semiconductor device 4 according to the fourth embodiment may be configured and operate in substantially the same way as the pull-up circuit 110 and the pull-down circuit 120 of the semiconductor device 1 according to the first embodiment, but the present inventive concepts are not limited thereto.

The first switch unit 350 includes a first transistor 351, a second transistor 352, an auxiliary circuit 310, and an output node CPout from which an output signal Icp is output.

The auxiliary circuit 310 includes a first PMOS transistor 312 and a second PMOS transistor 314. The first PMOS transistor 312 has a drain connected to an output terminal and a source connected to a source of the second PMOS transistor 314. A gate of the first PMOS transistor 312 is connected to a gate of the second PMOS transistor 314.

The first transistor 351 has a drain connected to a drain of the second PMOS transistor 314, a source connected to a first reference current source 330 (which faces a VDD terminal and the pull-up circuit 110, and a gate connected to a first signal. The first transistor 351 includes an NMOS transistor, and the first signal may be an up signal UP input from a PFD 10.

When the first transistor 351 is turned on, the first PMOS transistor 312 and the second PMOS transistor 314 of the auxiliary circuit 310 may be turned on by a first reference current Iup2 flowing to the first reference current source 330 and a first compensation current Iup1 provided by the pull-up circuit 110. Accordingly, a compensated pull-up current Iup may flow from the drain of the first PMOS transistor 312 toward the output terminal, thereby increasing the level of the output signal Icp.

The second transistor 352 may have a drain connected to the output node CPout and may be gated by a second signal, which is a complementary signal of the first signal, to reduce the level of the output signal Icp. The second transistor 352 may include an NMOS transistor, and the second signal may be a down signal DN input from the PFD 10. The second transistor 352 may have a source connected to a second reference current source 340 that faces the VDD terminal.

The second switch unit 360 may be connected to the first switch unit 350. The second switch unit 360 includes a third transistor 353 and a fourth transistor 354. The second switch unit 360 can increase the operating speed of a charge pump 20. However, the present inventive concepts are not limited thereto, and the second switch unit 360 can be omitted.

Specifically, the third transistor 253 may have a drain connected to a VDD terminal and a source connected to the source of the first transistor 351 and may be gated by a first signal. The third transistor 253 may include an NMOS transistor, and the first signal may be an inverted up signal UPB input from the PFD 10.

The fourth transistor 354 may have a drain connected to a VDD terminal and a source connected to a source of the second transistor 352 and may be gated by a second signal which is a complementary signal of the first signal. The fourth transistor 354 may include an NMOS transistor, and the second signal may be an inverted down signal DNB input from the PFD 10.

The semiconductor device 4 according to the fourth embodiment of the present inventive concepts may be substantially similar in effect to the semiconductor device 1 according to the first embodiment of the present inventive concepts, except for structure.

Figure 6:
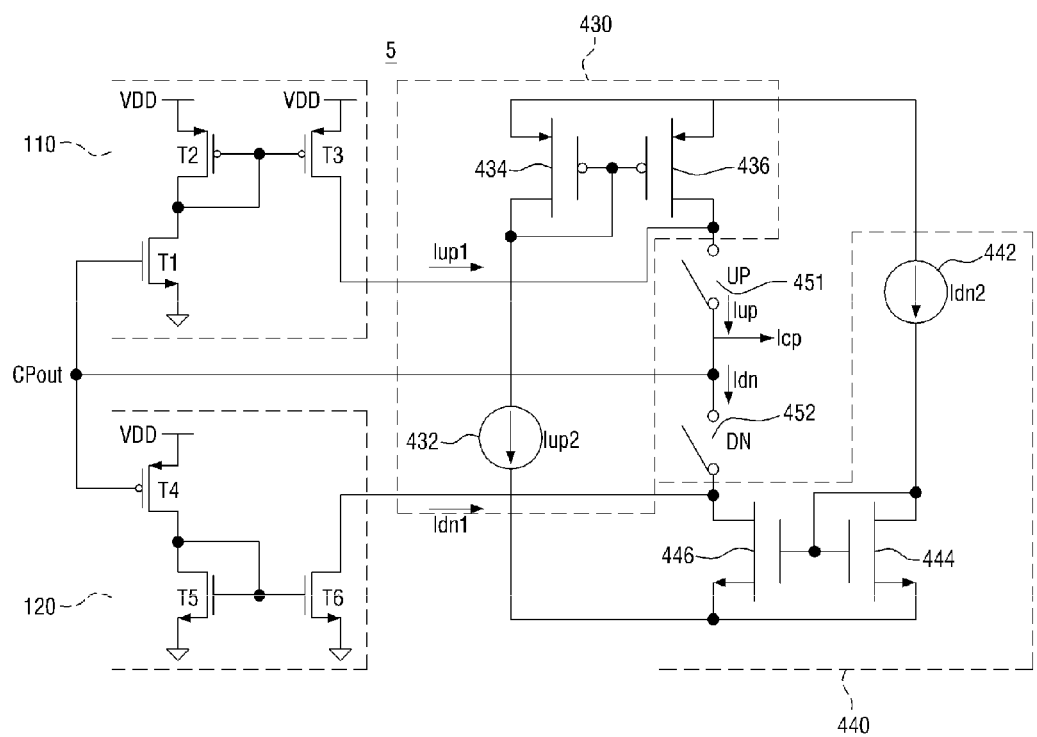
FIG. 6 is a circuit diagram of a semiconductor device according to a fifth embodiment of the present inventive concepts.

FIG. 6 is a circuit diagram of a semiconductor device 5 according to a fifth embodiment of the present inventive concepts. For simplicity, a redundant description of elements identical to those of the above-described embodiments will be omitted, and the current embodiment will hereinafter be described, focusing mainly on differences with the above-described embodiments.

Referring to FIG. 6, the semiconductor device 5 according to the fifth embodiment of the present inventive concepts includes a pull-up circuit 110, a pull-down circuit 120, a first switch 451, a second switch 452, a first reference current circuit 430, and a second reference current circuit 440.

The pull-up circuit 110, the pull-down circuit 120, the first reference current circuit 430 and the second reference current circuit 440 of the semiconductor device 5 according to the fifth embodiment of the present inventive concepts may be configured and operate in substantially the same way as the pull-up circuit 110, the pull-down circuit 120, the first reference current circuit 130 and the second reference current circuit 140 of the semiconductor device 1 according to the first embodiment, but the present inventive concepts are not limited thereto.

An output node CPout from which an output signal Icp is output may be connected to the first switch 451 which is operated by an up signal UP input from a PFD 10 and the second switch 452 which is operated by a down signal DN input from the PFD 10. The first switch 451 and the second switch 452 may be, but are not limited to, transistors.

The first switch 451 may be connected to the pull-up circuit 110 and the first reference current circuit 430 and provide a pull-up current Iup to an output terminal.

The second switch 452 may be connected to the pull-down circuit 120 and the second reference current circuit 440 and provide a pull-down current Idn to the output terminal.

The first reference current circuit 430 may provide a first reference current Iup2 to the first switch 451. The first reference current circuit 430 may include a first reference current source 432, a first PMOS transistor 434 which has a gate and a drain connected to the first reference current source 432, and a second PMOS transistor 436 which has a gate connected to the first reference current source 432 and provides the first reference current Iup2. In addition, the first reference current source 432 may be connected to a first NMOS transistor 444 and a second NMOS transistor 446 included in the second reference current circuit 440. The gate level of the second PMOS transistor 436 may be lowered by the first reference current source 432. Accordingly, the first reference current Iup2 flows from a source of the second PMOS transistor 436 toward a drain of the second PMOS transistor 436. The pull-up current Iup which is the sum of the first reference current Iup2 and a first compensation current Iup1 may flow to the output node CPout when the first switch 451 is turned on.

Likewise, the second reference current circuit 440 may provide a second reference current Idn2 to the second switch 452. The second reference current circuit 440 may include a second reference current source 442, the first NMOS transistor 444 which has a gate and a drain connected to the second reference current source 442, and the second NMOS transistor 446 which has a gate connected to the second reference current source 442 and provides the second reference current Idn2. In addition, the second reference current source 442 may be connected to the first PMOS transistor 434 and the second PMOS transistor 436 included in the first reference current circuit 430. The gate level of the second NMOS transistor 446 may be raised by the second reference current source 442. Accordingly, the second reference current Idn2 may flow from the drain of the second PMOS transistor 446 toward the source of the second PMOS transistor 446. The pull-down current Idn which is the sum of the second reference current Idn2 and a second compensation current Idn1 may flow from the output node CPout when the second switch 452 is turned on.

The semiconductor device 5 according to the fifth embodiment of the present inventive concepts may be substantially similar in effect to the semiconductor device 1 according to the first embodiment of the present inventive concepts, except for structure.

Figure 7:
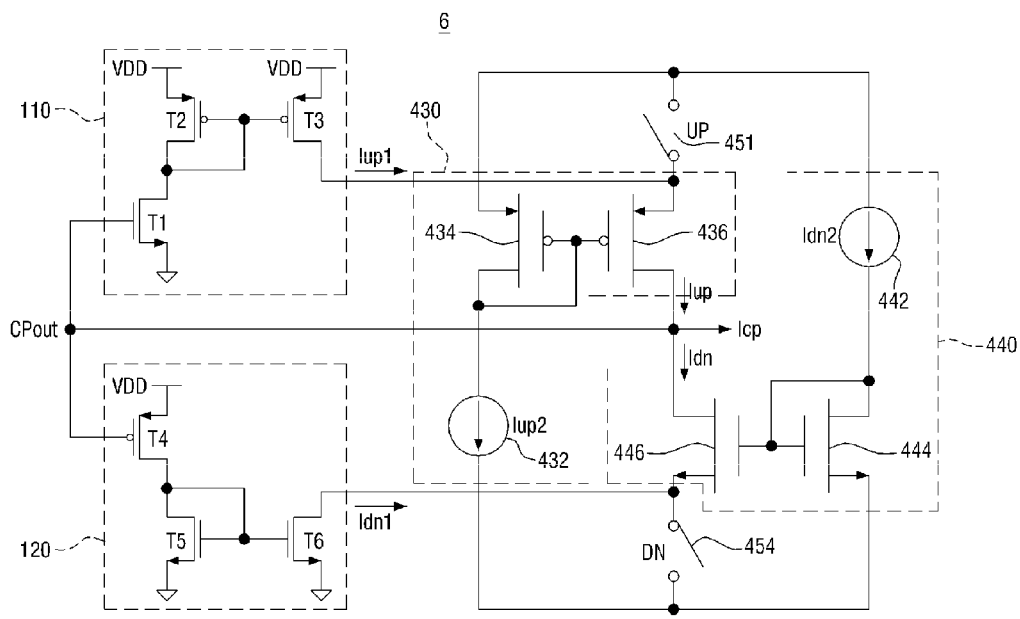
FIG. 7 is a circuit diagram of a semiconductor device according to a sixth embodiment of the present inventive concepts.

FIG. 7 is a circuit diagram of a semiconductor device 6 according to a sixth embodiment of the present inventive concepts. For simplicity, a redundant description of elements identical to those of the above-described embodiments will be omitted, and the current embodiment will hereinafter be described, focusing mainly on differences with the above-described embodiments.

Referring to FIG. 7, the semiconductor device 6 according to the sixth embodiment of the present inventive concepts may be configured substantially similarly to the semiconductor device 5 according to the fifth embodiment of the present inventive concepts.

However, a first switch 451 according to the sixth embodiment is connected to a source of a second PMOS transistor 436 of a first reference current circuit 430 and a second reference current source 442 of a second reference current circuit 440. A drain of the second PMOS transistor 436 is connected to an output node CPout.

Likewise, a second switch 452 is connected to a source of a second NMOS transistor 446 of the second reference current circuit 440 and a first reference current source 432 of the first reference current circuit 430. A drain of the second NMOS transistor 446 is connected to the output node CPout.

The semiconductor device 6 according to the sixth embodiment of the present inventive concepts may be substantially similar in effect to the semiconductor device 1 according to the first embodiment of the present inventive concepts, except for structure.

Figure 8:
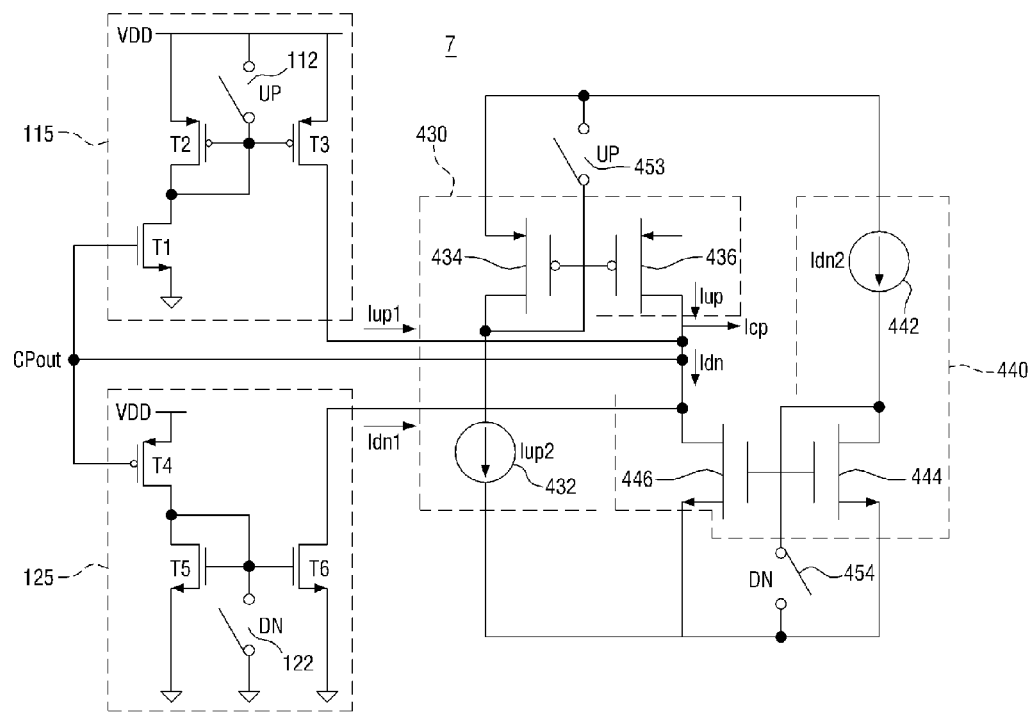
FIG. 8 is a circuit diagram of a semiconductor device according to a seventh embodiment of the present inventive concepts.

FIG. 8 is a circuit diagram of a semiconductor device 7 according to a seventh embodiment of the present inventive concepts. For simplicity, a redundant description of elements identical to those of the above-described embodiments will be omitted, and the current embodiment will hereinafter be described, focusing mainly on differences with the above-described embodiments.

Referring to FIG. 8, the semiconductor device 7 according to the seventh embodiment of the present inventive concepts may be configured substantially similarly to the semiconductor device 5 according to the fifth embodiment of the present inventive concepts.

However, a first switch 453 according to the seventh embodiment of the present inventive concepts are connected to a gate of a second PMOS transistor 436 of a first reference current circuit 430 and a second reference current source 442 of a second reference current circuit 440. A drain of a second PMOS transistor 436 is connected to an output node CPout.

Likewise, a second switch 454 is connected to a gate of a second NMOS transistor 446 of the second reference current circuit 440 and a first reference current source 432 of the first reference current circuit 430. A drain of the second NMOS transistor 446 is connected to the output node CPout.

In addition, a pull-up circuit 115 according to the seventh embodiment may further include a third switch 112 short-circuited by an up signal UP. An end of the third switch 112 may be connected to a gate of a first PMOS transistor T2 and a gate of a second PMOS transistor T3, and the other end of the third switch 112 may be connected to a VDD terminal.

Figure 9:
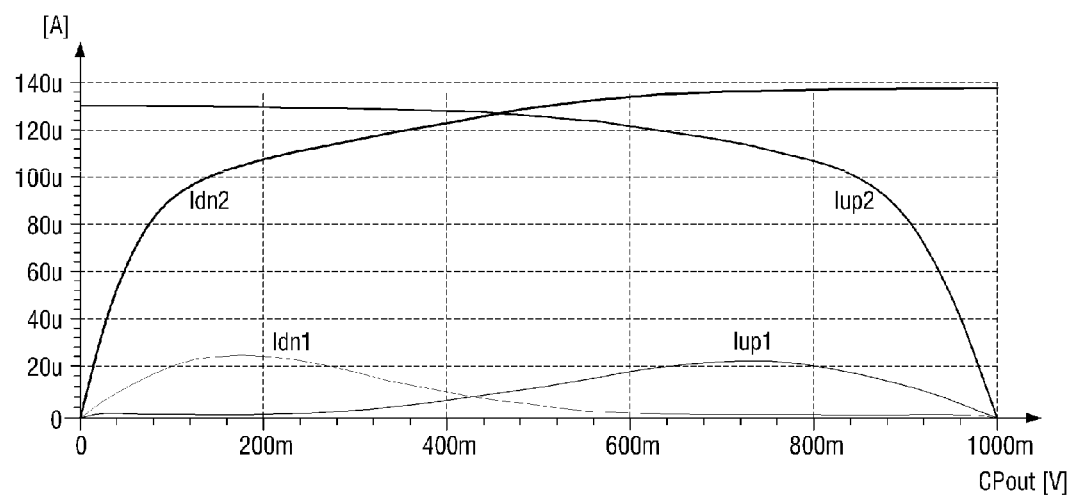
FIG. 9 is a graph illustrating reference currents and compensation currents of semiconductor devices according to embodiments of the present inventive concepts.
Figure 10:
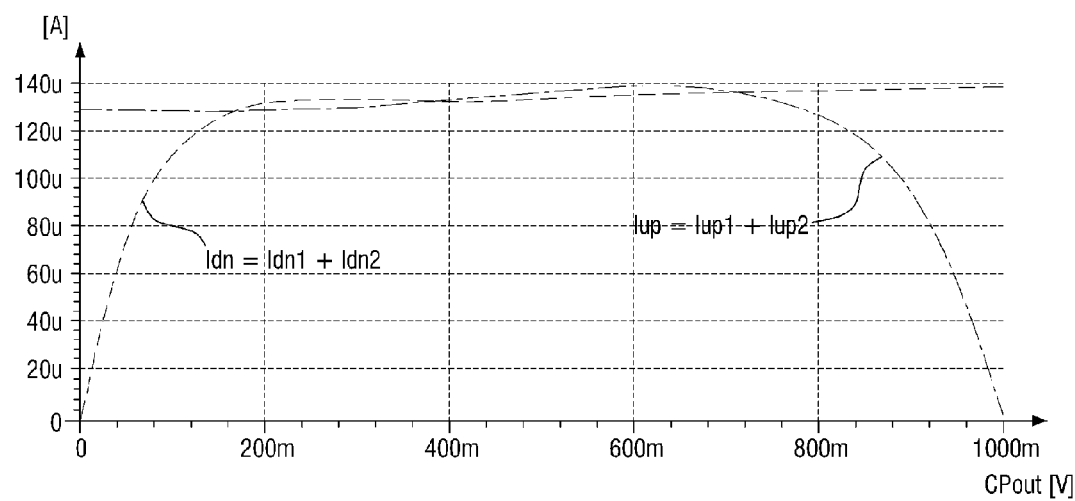
FIG. 10 is a graph illustrating output currents of semiconductor devices according to embodiments of the present inventive concepts.
Figure 11:
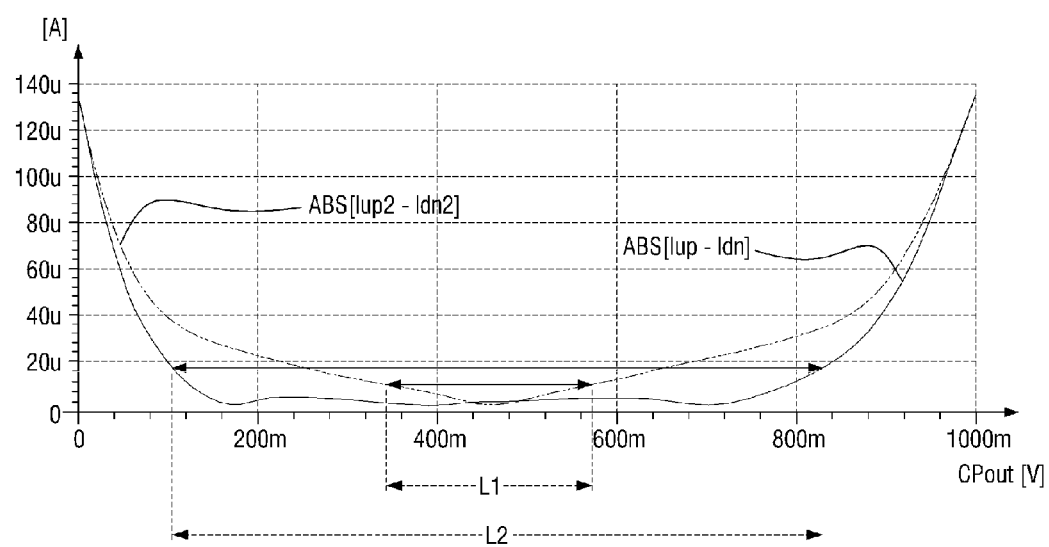
FIG. 11 is a graph illustrating the operating range of semiconductor devices according to embodiments of the present inventive concepts.

Likewise, a pull-down circuit 125 may further include a fourth switch 122 short-circuited by a down signal DN. An end of the fourth switch 122 may be connected to a gate of a first NMOS transistor T5 and a gate of a second NMOS transistor T6, and the other end of the fourth switch 122 may be connected to the VDD terminal FIG. 9 is a graph illustrating reference currents and compensation currents of semiconductor devices according to embodiments of the present inventive concepts. FIG. 10 is a graph illustrating output currents of semiconductor devices according to embodiments of the present inventive concepts. FIG. 11 is a graph illustrating the operating range of semiconductor devices according to embodiments of the present inventive concepts.

Referring to FIG. 9, in the semiconductor devices 1 through 7 according to the above-described embodiments of the present inventive concepts, as the level of the output node CPout increases, the magnitude of the first reference current Iup1 gradually increases, whereas the magnitude of the second reference current Idn2 gradually decreases. In particular, a current mismatch between the first reference current Iup2 and the second reference current Idn2 increases sharply as the level of the output node CPout changes.

Referring to the first compensation current Iup1 and the second compensation current Idn1, when the level of the output signal Icp increases, the magnitude of the first compensation current Iup1 is increased by a reduction in the first reference current Iup2. When the level of the output signal Icp decreases, the magnitude of the second compensation current Idn1 is increased by a reduction in the second reference current Idn2. However, when the level of the output node CPout becomes very close to VDD or VSS, both the first compensation current Iup1 and the second compensation current Idn1 are reduced.

In FIG. 10, the pull-up current Iup which is the sum of the first compensation current Iup1 and the first reference current Iup2 and the pull-down current Idn which is the sum of the second compensation current Idn1 and the second reference current Idn2 are illustrated.

Since the first compensation current Iup1 and the second compensation current Idn1 are increased by a reduction in the first reference current Iup2 and a reduction in the second reference current Idn2, respectively, a section in which a current mismatch between the pull-up current Iup and the pull-down current Idn occurs can be significantly reduced.

Referring to FIG. 11, 'ABS[Iup-Idn]' is a graph representing the difference between the pull-up current Iup and the pull-down current Idn in a case where the pull-up circuit 110 and the pull-down circuit 120 are not available, and 'ABS[Iup2-Idn2]' is a graph representing the difference between the pull-up current Iup and the pull-down current Idn compensated by the pull-up circuit 110 and the pull-down circuit 120.

An operating range L2 of the semiconductor devices (circuits) 1 through 7 including the pull-up circuit 110 and the pull-down circuit 120 may be much wider than an operating range L1 of a semiconductor device without the pull-up circuit 110 and the pull-down circuit 120. Therefore, the jitter of a PLL including the semiconductor devices (circuits) 1 through 7 of the present inventive concepts can be significantly reduced.

Figure 12:
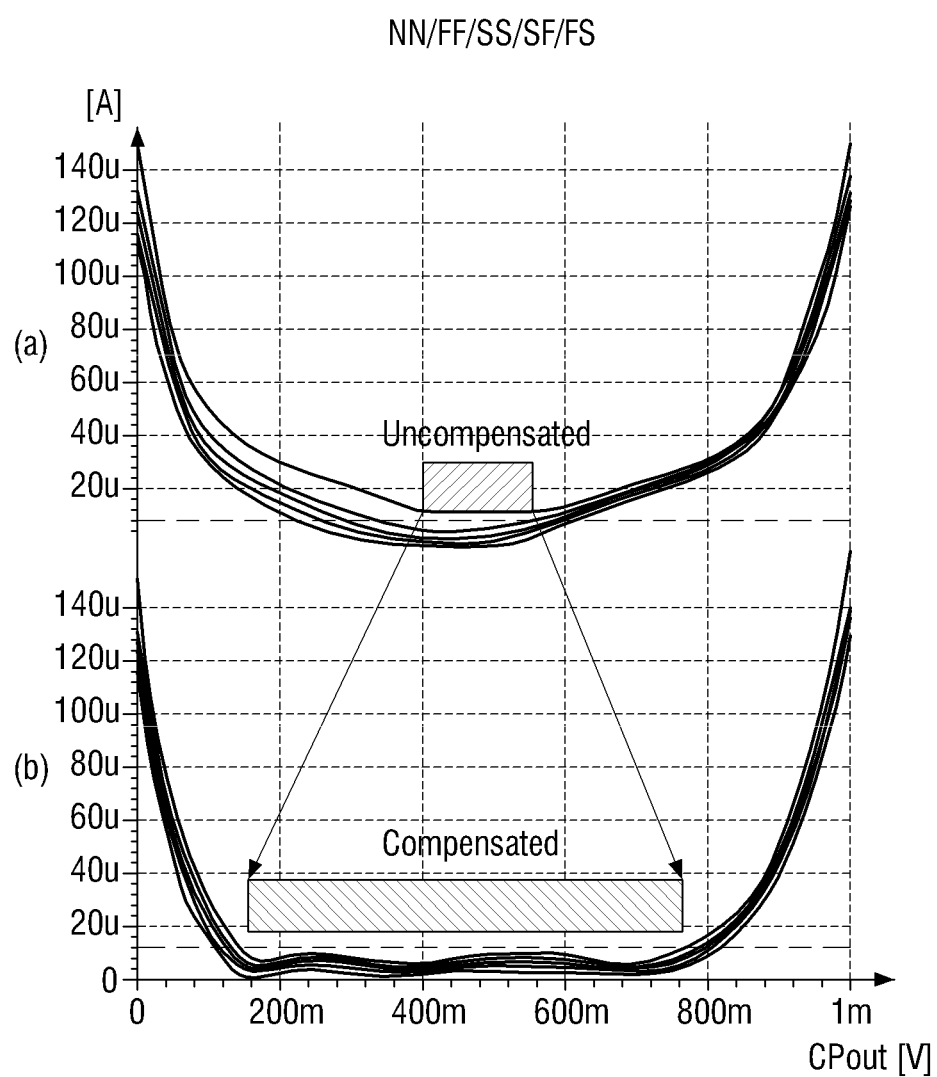
FIG. 12 is a graph illustrating the operating range of semiconductor devices according to embodiments of the present inventive concepts for 5 process corners.

FIG. 12 is a graph illustrating the operating range of semiconductor devices according to embodiments of the present inventive concepts for 5 process corners.

Referring to FIG. 12, graph (a) illustrates the difference between the pull-up current Iup and the pull-down current Idn of a semiconductor device which has a certain process corner (e.g., NN/FF/SS/SF/FS) and does not include the pull-up circuit 110 and the pull-down circuit 120. Graph (b) illustrates the difference between the pull-up current Iup and the pull-down current Idn of each of the semiconductor devices 1 through 7 according to the above-described embodiments which have a certain process corner (e.g., NN/FF/SS/SF/FS). A box on each of the graphs (a) and (b) represents the voltage range of the output node CPout having a current mismatch of less than 15%.

By comparing the operating range of the graph (a) and the operating range of the graph (b), it can be understood that if the pull-up circuit 110 and the pull-down circuit 120 are added to a semiconductor device, the operating range of the semiconductor device widens regardless of a process corner.

Figure 13:
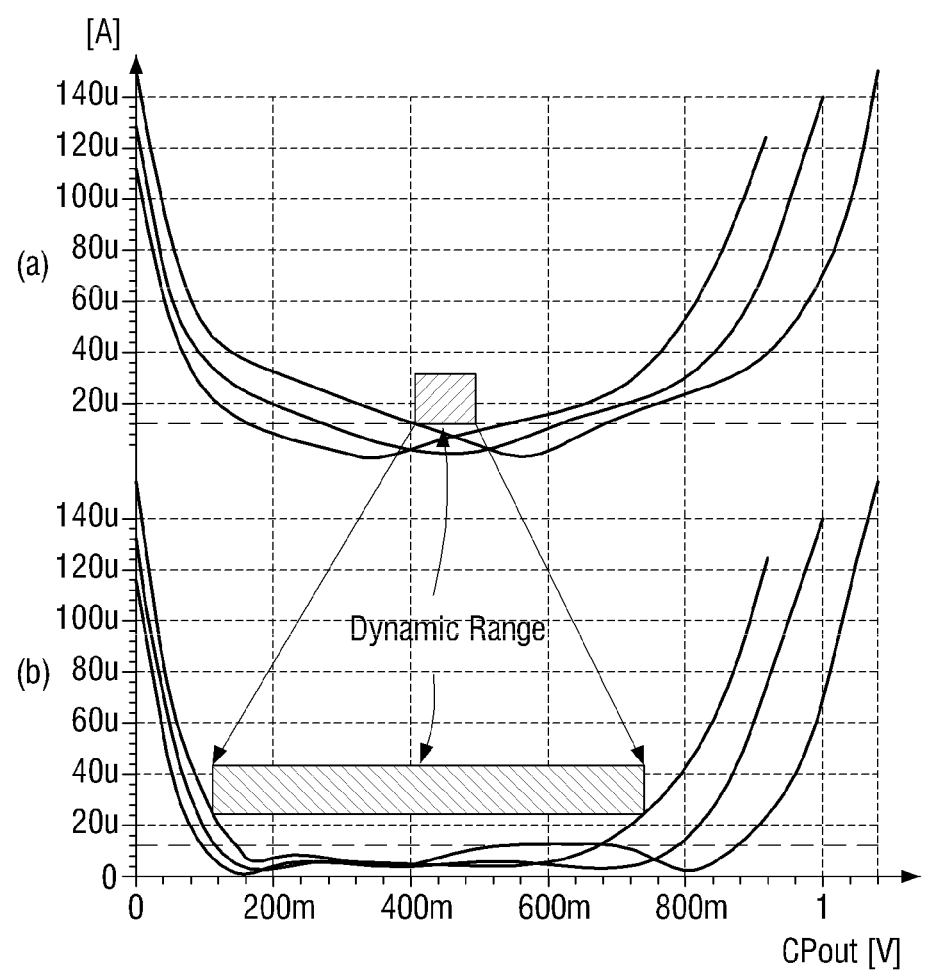
FIG. 13 is a graph illustrating the operating range of semiconductor devices according to embodiments of the present inventive concepts with respect to voltage.

FIG. 13 is a graph illustrating the operating range of semiconductor devices according to embodiments of the present inventive concepts with respect to voltage.

Referring to FIG. 13, graph (a) illustrates the difference between the pull-up current Iup and the pull-down current Idn of a semiconductor device, which does not include the pull-up circuit 110 and the pull-down circuit 120, at a certain voltage (e.g., 0.9 to 1.1 V). Graph (b) illustrates the difference between the pull-up current Iup and the pull-down current Idn of each of the semiconductor devices 1 through 7 according to the above-described embodiments of the present inventive concepts at a certain voltage (e.g., 0.9 to 1.1 V). A box on each of the graphs (a) and (b) represents the voltage range of the output node CPout having a current mismatch of less than 15%.

By comparing the operating range of the graph (a) and the operating range of the graph (b), it can be understood that if the pull-up circuit 110 and the pull-down circuit 120 are added to a semiconductor device, the operating range of the semiconductor device widens regardless of a change in voltage.

Figure 14:
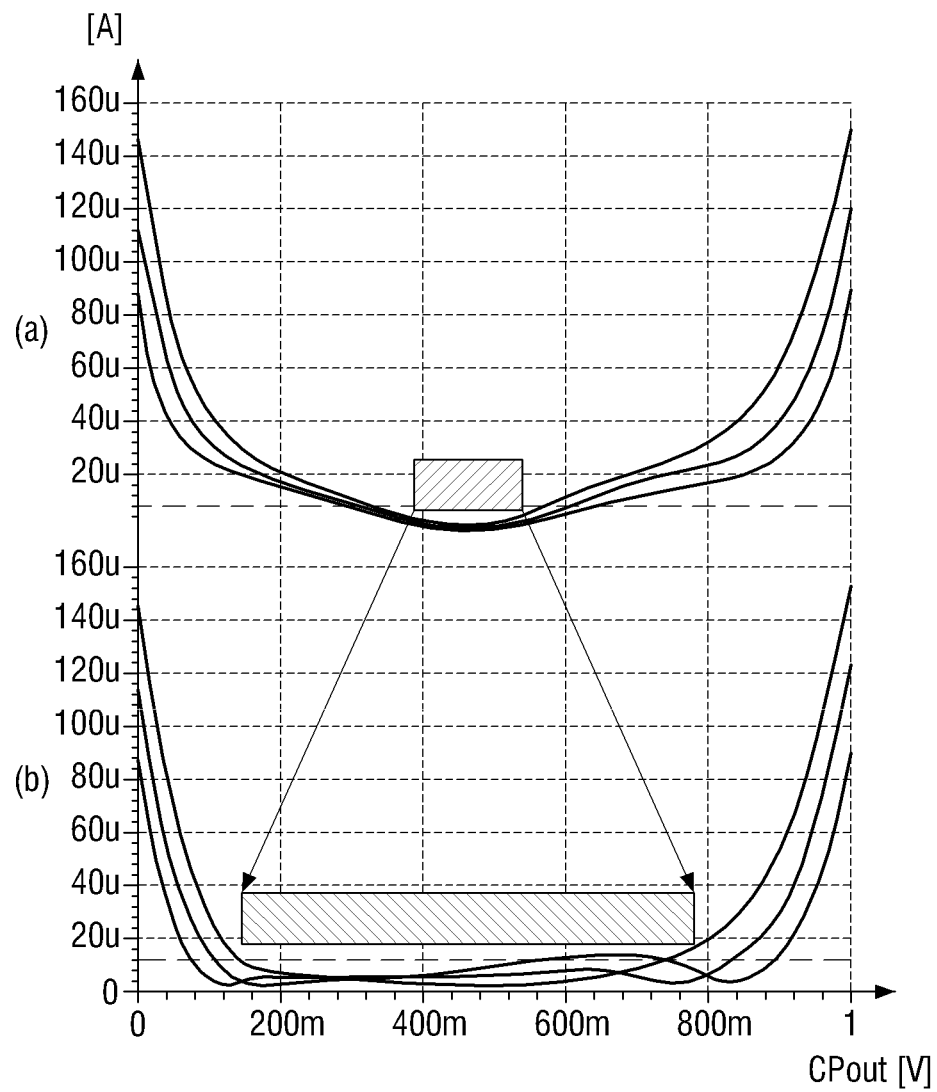
FIG. 14 is a graph illustrating the operating range of semiconductor devices according to embodiments of the present inventive concepts with respect to temperature.

FIG. 14 is a graph illustrating the operating range of semiconductor devices according to embodiments of the present inventive concepts with respect to temperature.

Referring to FIG. 14, graph (a) illustrates the difference between the pull-up current Iup and the pull-down current Idn of a semiconductor device, which does not include the pull-up circuit 110 and the pull-down circuit 120, at a certain temperature (e.g., −45 to 125° C.). Graph (b) illustrates the difference between the pull-up current Iup and the pull-down current Idn of each of the semiconductor devices 1 through 7 according to the above-described embodiments of the present inventive concepts at a particular temperature (e.g., −45 to 125° C.). A box on each of the graphs (a) and (b) represents the voltage range of the output node CPout having a current mismatch of less than 15%.

By comparing the operating range of the graph (a) and the operating range of the graph (b), it can be understood that if the pull-up circuit 110 and the pull-down circuit 120 are added to a semiconductor device, the operating range of the semiconductor device widens regardless of a change in temperature.

Figure 15:
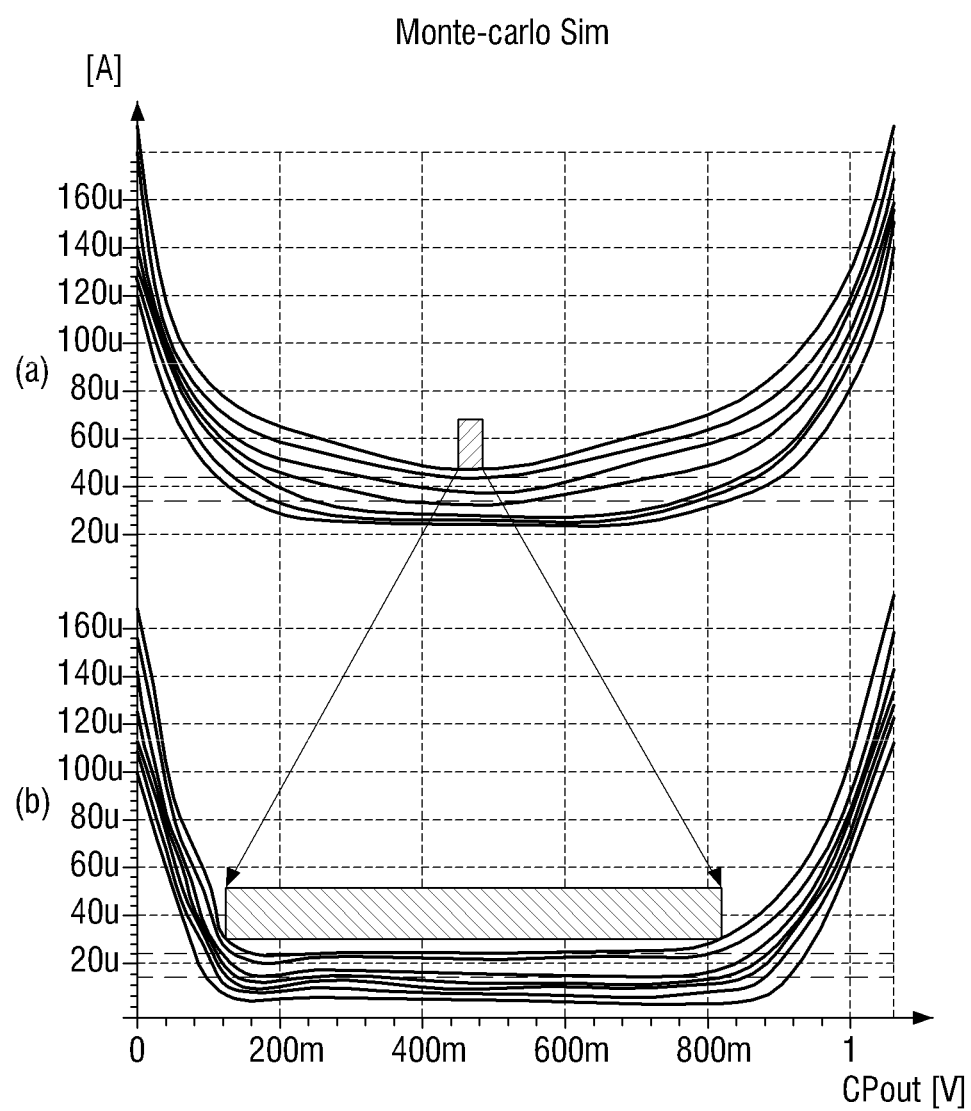
FIG. 15 is a graph illustrating the operating range of semiconductor devices according to embodiments of the present inventive concepts for Monte-Carlo simulation.

FIG. 15 is a graph illustrating the operating range of semiconductor devices according to embodiments of the present inventive concepts for Monte-Carlo simulation.

Referring to FIG. 15, graph (a) illustrates the difference between the pull-up current Iup and the pull-down current Idn of a semiconductor device, which does not include the pull-up circuit 110 and the pull-down circuit 120, in a Monte-Carlo simulation for testing the operation of the semiconductor device by randomly changing a process in the semiconductor device. Graph (b) illustrates the difference between the pull-up current Iup and the pull-down current Idn of each of the semiconductor devices 1 through 7 according to the above-described embodiments of the present inventive concepts in the Monte-Carlo simulation. A box on each of the graphs (a) and (b) represents the voltage range of the output node CPout having a current mismatch of less than 15%.

By comparing the operating range of the graph (a) and the operating range of the graph (b), it can be understood that if the pull-up circuit 110 and the pull-down circuit 120 are added to a semiconductor device, the operating range of the semiconductor device widens regardless of the type of process and a change in properties.

As apparent from the graphs of FIGS. 12 through 15, the operating range of each of the semiconductor devices 1 through 7 according to the above-described embodiments of the present inventive concepts which include the pull-up circuit 110 and the pull-down circuit 120 increases regardless of the type of process, voltage changes, and temperature changes.

Figure 16:
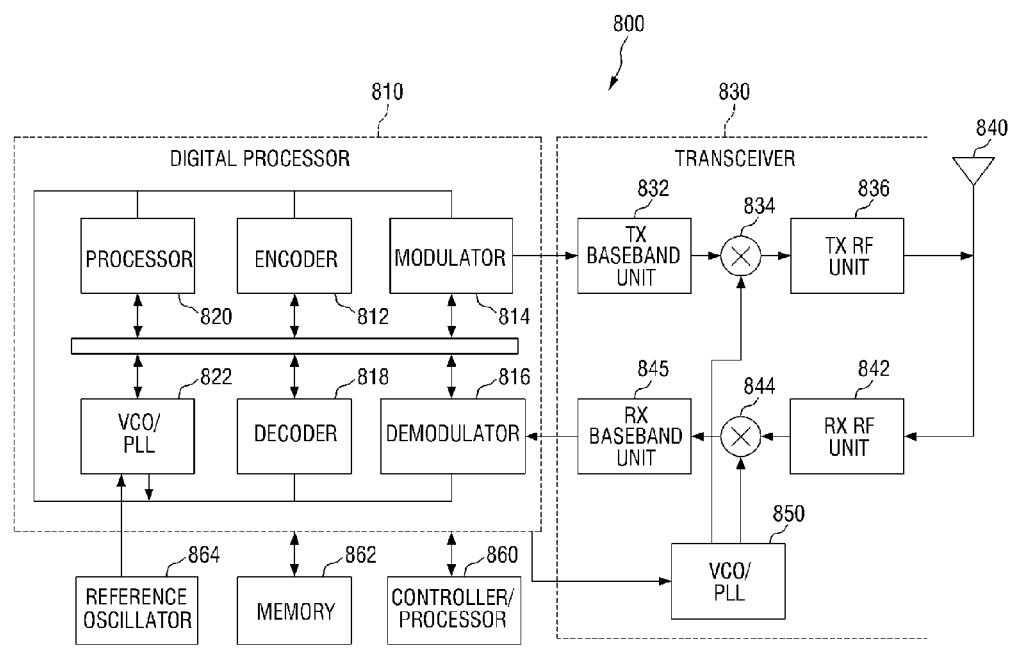
FIG. 16 is a block diagram of a wireless device including semiconductor devices according to embodiments of the present inventive concepts.

FIG. 16 is a block diagram of a wireless device 800 including semiconductor devices according to embodiments of the present inventive concepts.

Referring to FIG. 16, the wireless device 800 may be a mobile phone, a terminal, a personal digital assistant (PDA), a handset, or any other device. The wireless device 800 may include a code division multiple access (CDMA) system, a time division multiple access (TDMA) system, a frequency division multiple access (FDMA) system, a global system for mobile communications (GSM) system, an orthogonal frequency division multiple access (OFDMA) system, and a wireless local area network (WLAN).

The wireless device 800 includes a digital processor 810 and a transceiver 830 which support bidirectional communication. The digital processor 810 may be implemented as one or more application specific integrated circuits (ASICs). The transceiver 830 may be implemented as one or more radio frequency integrated circuits (RFICs).

For data transmission, an encoder 812 processes (e.g., formats, encodes and interleaves) data to be transmitted, and a modulator 814 processes (e.g., modulates and scrambles) data coded to generate a data chip. In the transceiver 830, a transmission (TX) baseband unit 832 performs a baseband process such as digital-to-analog conversion, filtering, amplification, etc. A mixer 834 upconverts a baseband signal into a radio frequency (RF) signal. A TX RF unit 836 performs signal conditioning such as filtering and power amplification and generates an RF modulation signal that is to be transmitted through an antenna 840.

For data reception, a reception (RX) RE unit 842 receives an input RF signal from the antenna 840 and performs signal conditioning such as low-noise amplification and filtering. A mixer 844 downconverts the conditioned RF signal into a baseband signal. An RX baseband unit 845 performs a baseband process such as filtering, amplification, analog-to-digital conversion, etc. A demodulator 816 provides a symbol estimate by processing (descrambling and demodulating) samples input from the RX baseband unit 845. A decoder 818 processes (deinterleaves and decodes) the symbol estimate and provides decoded data. Generally, processes performed by the digital processor 810 and the transceiver 830 vary according to the design of the wireless device (system) 800.

A processor 820 may support various applications such as video, audio, graphics, etc. A controller/processor 860 instructs the operation of various processing devices within the wireless device 800. A memory 862 stores program code and data for the wireless device 800.

A VCO/PLL 822 generates a clock signal for the processing devices within the digital processor 810. The VCO/PLL 822 generates a transmission local oscillator (LO) signal used by the mixer 834 for frequency upconversion and a reception LO signal used by the mixer 844 for frequency downconversion. Each of the VCO/PLL 822 and a VCO/

PLL 850 uses a linear PFD and a charge pump for performance improvement. A reference oscillator 864 generates a reference signal for the VCO/PLL 822 and/or the VCO/PLL 850. The reference oscillator 864 may be a crystal oscillator (XO), a voltage-controlled. XO (VCXO), a temperature-compensated XO (TCXO), or any other type of oscillator.

A PFD, a charge pump and a PLL specified in the present application can also be implemented in an analog IC, an RFIC, an ASIC, a digital signal processor (DSP), a digital signal processing device (DSPD), a programmable logic device (PLD), a field programmable gate array (FPGA), a processor, a controller, a microcontroller, a microprocessor, and other electronic devices. The PFD, the charge pump and the PLL can be fabricated using various IC process technologies such as N-MOS, P-MOS, CMOS, BJT, GaAs, etc. In addition, the PFD, the charge pump and the PLL can be implemented as individual components.

An electronic system including the semiconductor devices 1 through 7 according to the embodiments of the present inventive concepts will now be described with reference to FIG. 17.

Figure 17:
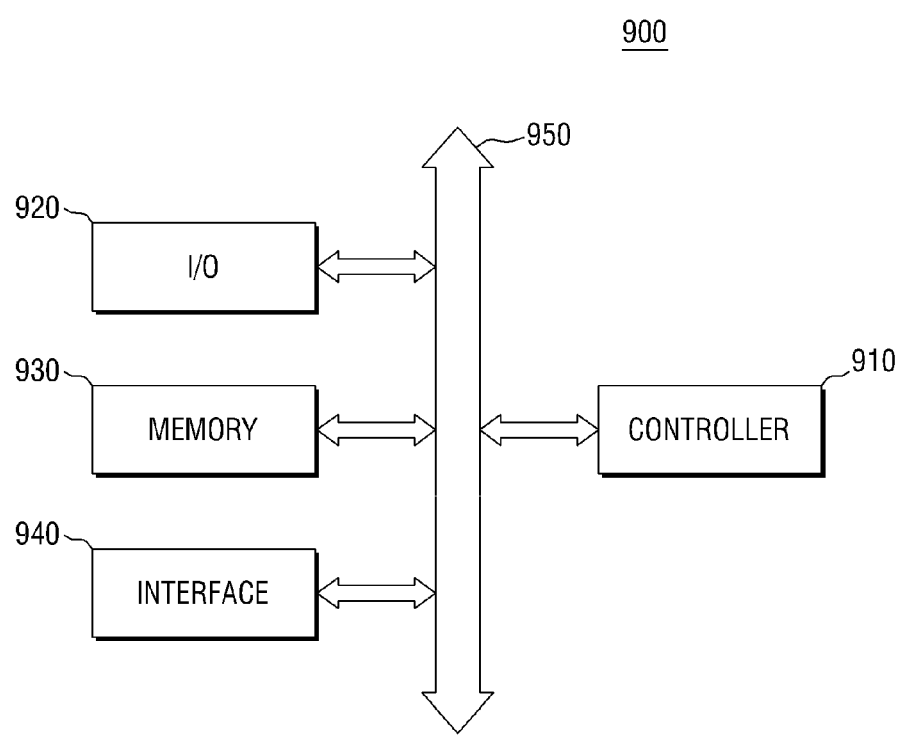
FIG. 17 is a block diagram of an electronic system including semiconductor devices according to embodiments of the present inventive concepts.

FIG. 17 is a block diagram of an electronic system 900 including semiconductor devices according to embodiments of the present inventive concepts.

Referring to FIG. 17, the electronic system 900 according to an embodiment of the present inventive concepts may include a controller 910, an input/output (I/O) device 920, a memory device 930, an interface 940 and a bus 950. The controller 910, the I/O device 920, the memory device 930 and/or the interface 940 may be connected to one another by the bus 950. The bus 950 may serve as a path for transmitting data.

The controller 910 may include at least one of a microprocessor, a digital signal processor, a microcontroller and logic devices capable of performing similar functions to those of a microprocessor, a digital signal processor and a microcontroller. The I/O device 920 may include a keypad, a keyboard and a display device. The memory device 930 may store data and/or commands. The interface 940 may be used to transmit data to or receive data from a communication network. The interface 940 may be a wired or wireless interface. In an example, the interface 940 may include an antenna or a wired or wireless transceiver.

Although not illustrated in the drawing, the electronic system 900 may be an operating memory for improving the operation of the controller 910, and may also include a high-speed DRAM or SRAM. Here, any one of the semiconductor devices 1 through 7 according to the above-described embodiments of the present inventive concepts may be employed as the operating memory. In addition, any one of the semiconductor devices 1 through 7 according to the above-described embodiments may be provided in the memory device 930 or in the controller 910 or the I/O device 920.

The electronic system 900 may be applied to a PDA, a portable computer, a web tablet, a wireless phone, a mobile phone, a digital music player, a memory card, or nearly all types of electronic products capable of transmitting and/or receiving information in a wireless environment.

Figure 18:
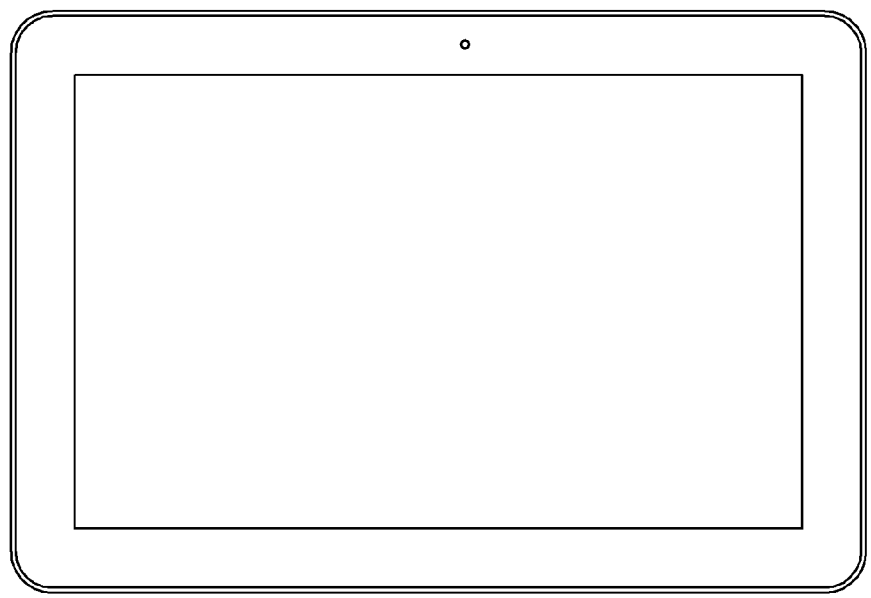
FIGS. 18 through 20 illustrate examples of a semiconductor system to which semiconductor devices according to embodiments of the present inventive concepts can be applied.
Figure 19:
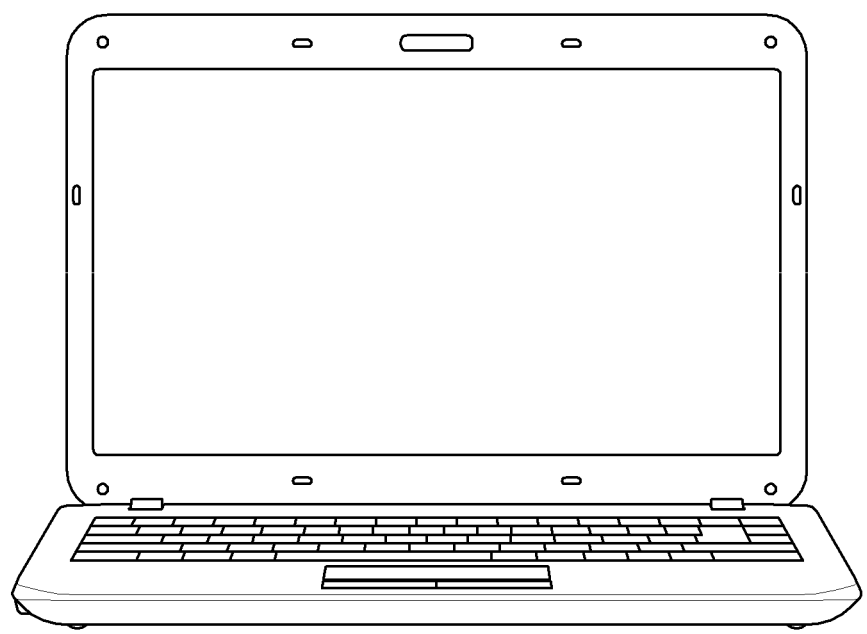
Figure 20:
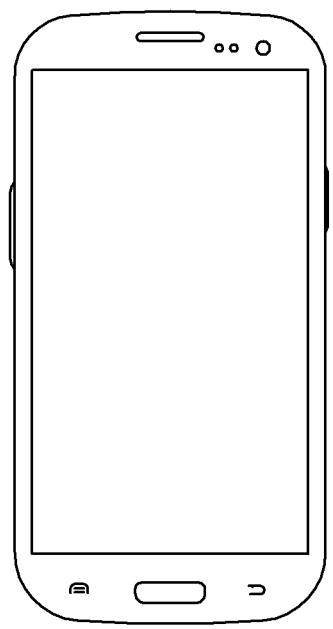

FIGS. 18 through 20 illustrate examples of a semiconductor system to which semiconductor devices according to embodiments of the present inventive concepts can be applied.

FIG. 18 illustrates a tablet personal computer (PC) 1100, FIG. 19 illustrates a notebook computer 1100, and FIG. 20 illustrates a smartphone 1200. At least one of the semiconductor devices 1 through 7 according to the above-described embodiments of the present inventive concepts, as set forth herein, may be used in the tablet PC 1000, the notebook computer 1100, and the smartphone 1200.

Semiconductor devices according to embodiments of the present inventive concepts, as set forth herein, may also be applied to various IC devices other than those set forth herein. That is, while the tablet PC 1000, the notebook computer 1100, and the smartphone 1200 have been described above as examples of a semiconductor system according to the current embodiment of the present inventive concepts, the examples of the semiconductor system according to the current embodiment are not limited to the tablet PC 1000, the notebook computer 1100, and the smartphone 1200. In some embodiments of the present inventive concepts, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
an output node from which an output signal is output;
a first transistor which has a drain connected to the output node and is gated by a first signal to increase a voltage level of the output node;
a second transistor which has a drain connected to the output node, is gated by a second signal which is a complementary signal of the first signal, and reduces the voltage level of the output node;
a pull-up circuit which provides a first compensation current varying according to the voltage level of the output node to a source of the first transistor; and
a pull-down circuit which provides a second compensation current varying according to the voltage level of the output node to a source of the second transistor.

2. The semiconductor device of claim 1, wherein the pull-up circuit comprises:
a first NMOS transistor which is gated by the voltage level of the output node;
a first PMOS transistor which has a gate and a drain connected to a drain of the first NMOS transistor; and
a second PMOS transistor which has a gate connected to the drain of the first NMOS transistor and provides the first compensation current.

3. The semiconductor device of claim 1, the pull-down circuit comprises:
a first PMOS transistor which is gated by the voltage level of the output node;
a first NMOS transistor which has a gate and a drain connected to a drain of the first PMOS transistor; and a second NMOS transistor which has a gate connected to the drain of the first PMOS transistor and provides the second compensation current.

4. The semiconductor device of claim 1, further comprising a first reference current source which provides a first reference current to the source of the first transistor, wherein when the first transistor is turned on, the first transistor provides a pull-up current to the output node, wherein the pull-up current corresponds to the sum of the first reference current and the first compensation current and flows in a direction from the source of the first transistor toward the drain of the first transistor.

5. The semiconductor device of claim 1, further comprising a second reference current source which provides a second reference current to the source of the second transistor, wherein when the second transistor is turned on, the second transistor provides a pull-down current to the output node, wherein the pull-down current corresponds to the sum of the second reference current and the second compensation current and flows in a direction from the drain of the second transistor toward the source of the second transistor.

6. The semiconductor device of claim 1, wherein the first transistor is a PMOS transistor, and the second transistor is an NMOS transistor.

7. The semiconductor device of claim 1, further comprising:
a third transistor which is connected to the source of the first transistor and is gated by an inverted signal of the first signal; and
a fourth transistor which is connected to the source of the second transistor and is gated by an inverted signal of the second signal.

8. The semiconductor device of claim 7, wherein a drain of the third transistor is connected to VSS, and a drain of the fourth transistor is connected to VDD.

9. The semiconductor device of claim 7, further comprising an operational amplifier having an output terminal connected to the third transistor and the fourth transistor, wherein one of inputs of the operational amplifier is connected to the output node.

10. A semiconductor device comprising:
a charge pump circuit which increases a voltage level of an output node by receiving a pull-up current and reduces the voltage level of the output node by outputting a pull-down current;
a pull-up circuit which provides a first compensation current for increasing the magnitude of the pull-up current to a source of a first transistor when the voltage level of the output node increases from a first level to a second level higher than the first level; and
a pull-down circuit which provides a second compensation current for increasing the magnitude of the pull-down current to a source of the second transistor when the voltage level of the output node decreases from a third level to a fourth level lower than the third level.

11. The semiconductor device of claim 10, further comprising:
a first switch which is connected to the pull-up circuit and the output node and provides the pull-up current;
a second switch which is connected to the pull-down circuit and the output node and provides the pull-down current;
a first reference current circuit which provides a first reference current to the first switch; and
a second reference current circuit which provides a second reference current to the second switch.

12. The semiconductor device of claim 11, wherein the magnitude of the first compensation current is increased by a reduction in the first reference current when the voltage level of the output node increases, and the magnitude of the second compensation current is increased by a reduction in the second reference current when the voltage level of the output node decreases.

13. The semiconductor device of claim 11, wherein the first reference current circuit comprises:
a first reference current source;
a first PMOS transistor which has a gate and a drain connected to the first reference current source; and
a second PMOS transistor which has a gate connected to the first reference current source and provides the first reference current.

14. The semiconductor device of claim 13, wherein the first reference current source is connected to first and second NMOS transistors included in the second reference current circuit.

15. The semiconductor device of claim 10, further comprising:
a first reference current circuit which provides a first reference current to the output node;
a second reference current circuit which provides a second reference current to the output node;
a first switch which is connected to the pull-up circuit and the first reference current circuit and provides the pull-up current; and
a second switch which is connected to the pull-down circuit and the second reference current circuit and provides the pull-down current.

16. The semiconductor device of claim 10, wherein the pull-up circuit comprises:
a first NMOS transistor which is gated by an output voltage of the output node;
a first PMOS transistor which has a gate and a drain connected to a drain of the first NMOS transistor; and
a second PMOS transistor which has a gate connected to the drain of the first NMOS transistor and provides the first compensation current.

17. The semiconductor device of claim 16, further comprising a third switch which is controlled by an up signal and connected to the gates of the first and second PMOS transistors.

18. The semiconductor device of claim 10, wherein the pull-down circuit comprises:
a first PMOS transistor which is gated by the output voltage;
a first NMOS transistor which has a gate and a drain connected to a drain of the first PMOS transistor; and
a second NMOS transistor which has a gate connected to the drain of the first PMOS transistor and provides the second compensation current.

19. A phase-locked loop (PLL) comprising:
a charge pump;
a phase frequency detector (PFD) which provides an up input signal and a down input signal, which is a complementary signal of the up signal, to the charge pump; and
a loop filter which is connected to an output node of the charge pump,
wherein the charge pump comprises:
a first transistor which is gated by the up signal;
a second transistor which is gated by the down signal;
the output node which is connected to a drain of the first transistor and a drain of the second transistor;

a pull-up circuit which comprises a third transistor gated by an output voltage of the output node and a fourth transistor gated by a drain voltage of the third transistor and connected to the first transistor; and a pull-down circuit which comprises a fifth transistor gated by the output voltage and a sixth transistor gated by a drain voltage of the fifth transistor and connected to the second transistor.

\* \* \* \* \*